United States Patent [19]

Baker et al.

[11] Patent Number: 4,658,332
[45] Date of Patent: Apr. 14, 1987

[54] COMPLIANT LAYER PRINTED CIRCUIT BOARD

[75] Inventors: Thomas E. Baker, Northboro, Mass.; S. Bert Krasnow, Lake Worth, Fla.; Richard A. Silverman, Berlin, Mass.

[73] Assignee: Raytheon Company, Lexington, Mass.

[21] Appl. No.: 777,869

[22] Filed: Sep. 19, 1985

Related U.S. Application Data

[63] Continuation of Ser. No. 482,073, Apr. 4, 1983, abandoned.

[51] Int. Cl.[4] .............................................. H05K 1/18
[52] U.S. Cl. .................................. 361/398; 174/68.5; 361/403; 361/414
[58] Field of Search ............... 174/68.5; 361/386-389, 361/395-400, 412, 414; 29/832

[56] References Cited

U.S. PATENT DOCUMENTS

| | | | |
|---|---|---|---|
| 3,268,653 | 8/1966 | McNutt | 174/68.5 |
| 3,818,279 | 6/1974 | Seeger et al. | 361/407 X |
| 3,828,215 | 8/1974 | Bilsback | 313/50 |
| 4,115,185 | 9/1978 | Carlson et al. | 156/634 |
| 4,149,219 | 4/1979 | Kraft | 361/386 |
| 4,197,586 | 4/1980 | Nidiffer | 364/708 |
| 4,413,309 | 10/1983 | Takahashi et al. | 361/406 |
| 4,434,321 | 2/1984 | Betts | 174/68.5 |
| 4,438,560 | 3/1984 | Kisters | 29/830 |
| 4,495,546 | 1/1985 | Nakamura et al. | 361/412 X |
| 4,528,064 | 7/1985 | Ohsawa et al. | 174/68.5 X |

FOREIGN PATENT DOCUMENTS 0064854 11/1984 European Pat. Off. .

OTHER PUBLICATIONS

Mah ElRefaie, "Chip-Package Substrate Cushions Dense, High-Speed Circuitries, Electronics", Jul. 14, 1982 pp. 135-141.

Fishman et al., "Mounting Leadless Chip Carriers onto Printed Circuit Cards", International Electronic Pack, Conf., Cleveland, Ohio, Nov. 9-10, 1981 pp. 45-59.

Ardito et al., Making Intergral Multilayer Circuit Boards with Cable Connections, IBM Tech. Disc. Bull., V. 14 #3, Aug. 1971 pp. 701 & 2.

IBM Technical Disclosure Bulletin F. P. Ardito and R. W. Stockdale, "Making Integral Multilayer Circuit Bords with Cable Connection", vol. 14 No. 3, Aug. 1971, p. 701.

"Chip-Package Substrate Cushions Dense, High-Speed Circuitries", by Mah El Refaie Electronics/Jul. 14, 1982, pp. 135-141.

"Mounting Leadless Chip Carriers on to Printed Circuit Cards", by D. Fishman and N. Cooper International Electronic Packaging Conference, Cleveland, Ohio—Nov. 9-10, 1981 pp. 45-59.

Primary Examiner—R. R. Kucia
Attorney, Agent, or Firm—Walter F. Dawson; Richard M. Sharkansky

[57] ABSTRACT

A printed circuit board having a compliant layer sandwiched between a pattern of conductors and an insulating layer. The printed circuit board has leadless chip carriers attached to soldering pads on the board using conventional soldering techniques. The elasticity of the compliant layer between the pattern of conductors and the insulating layer provides mechanical decoupling for minimizing stresses on the solder joints due to the different thermal coefficients of expansion of contiguous materials.

32 Claims, 2 Drawing Figures

COMPLIANT LAYER PRINTED CIRCUIT BOARD

The Government has rights in this invention pursuant to Subcontract 640 with Raytheon Company under Contract Number N00030-81-C-0133 with Charles Stark Draper Laboratory awarded by the Department of the Navy, Strategic Systems Project Office.

This application is a continuation of application Ser. No. 482,073, filed Apr. 4, 1983, now abandoned.

BACKGROUND OF THE INVENTION

This invention relates to a printed circuit board (PCB) and more particularly to a PCB having minimized stresses between said board and leadless chip carriers (LCC) mounted thereon, such stresses being primarily the result of different thermal coefficients of expansion of contiguous materials of the PCB and the LCC.

Although printed circuit boards are well-known in the electronics industry, the evolution of LSI (large scale integrated) and VLSI (very large scale integrated) circuits have required new packaging techniques. One of these techniques includes the use of leadless chip carriers for mounting on some type of printed circuit board. One of the common problems with the use of leadless chip carriers is the thermal mismatch between the LCC and a printed circuit board. The different thermal coefficients of expansion (TCE) of an LCC and a PCB cause fatigue cracking of the interfacing solder joints particularly over the military applications temperature range of $-55°$ C. to $°125°$ C.

There have been various approaches in attempting to develop a closer thermal match between an LCC and a PCB. One known approach has been to introduce compliancy into electrical connection points by building up the PCB pads into raised copper pedestals or bumps to allow the joints to yield a little during thermal cycling. Another approach in the industry for solving the thermal mismatch problem is to mount leadless chip carriers on an intermediate ceramic substrate and then mount that substrate to a printed circuit motherboard. Still other approaches have used sockets and clips to solve the thermal mismatch problem. See "Chip Carriers: Coming Force in Packaging", Electronic Packaging and Production Magazine, March 1981, pgs. 64–80.

Another prior art approach provides a PCB metal core substrate having the best characteristics of both PCB and ceramics such as the electrical characteristics of PCB and the high interconnection density, low numbers of layers and good heat dissipating ability of ceramic thick film multilayers. This approach utilizes high density discrete wiring as the interconnection technique, however, thermal mismatch problems have not been eliminated with this approach. See "Use of Metal Core Substrates for Leadless Chip Carrier Interconnection", Electronic Packaging and Production Magazine, March 1981, pgs. 98–104.

In U.S. Pat. No. 4,318,954, a PCB substrate is disclosed which comprises a conventional PCB (such as a glass fiber reinforced epoxy PCB) secured to a fiber reinforced plastic support having a thermal coefficient of expansion which closely approaches zero. By securing the conventional PCB to such a support member through an adhesive, the PCB has an apparent coefficient of thermal expansion at its surface approximating that of a ceramic chip carrier while retaining its normal coefficient of thermal expansion in its thickness direction. The support member is fabricated from graphite filament reinforced epoxy resins which has an extremely low thermal coefficient of expansion. When a ceramic chip carrier is connected to such a PCB composite laminate, the resulting solder joints do not experience significant stresses when exposed to thermal variations although such a PCB may offer certain disadvantages in some applications.

SUMMARY OF THE INVENTION

The invention discloses a section of a printed circuit board having an insulating support layer and another layer disposed on the support layer comprising an insulating compliant material for providing an elastic interface to said support layer. A pattern of conductors is disposed over the compliant material for performing electrical interconnections. The compliant material yields to forces of contiguous materials which result from the thermal expansion of said materials over a temperature range. The pattern of conductors provides for the attaching of at least one leadless carrier to the printed circuit board.

The invention further discloses a printed circuit board having means for attaching at least one leadless carrier to the board and means underlying the attaching means for decoupling forces resulting from thermal expansions of the contiguous materials. Means are provided for interconnecting signals of the leadless carrier, and there are means for insulating a plurality of the interconnecting means from each other. Furthermore, there are means for adhering the interconnecting means and the insulating means together. The decoupling forces means comprises a compliant material having a Youngs Modulus of less than 20,000 psi over an operating temperature range. A layer of resin impregnated glass fiber cloth protects the bottom surface of the printed circuit board.

The invention further discloses a printed circuit board assembly having at least one leadless carrier means attached to a first conductive means. A compliant layer of material underlying the first conductive means provides an elastic interface to contiguous materials above and below the compliant layer that generate forces resulting from thermal expansions of the contiguous materials. A first insulating layer means underlying the compliant layer provides structural support to the compliant layer, and a second conductive means coupled to the first insulating layer means provides for electrical interconnections. A first bonding means attaches the second conductive means to an adjacent third conductive means. A second insulating layer means has a top surface adjacent to the third conductive means and a bottom surface adjacent to a fourth conductive means. A second bonding means attaches the fourth conductive means to an adjacent fifth conductive means. A third insulating layer means has a top surface adjacent to the fifth conductive means and a bottom surface adjacent to a sixth conductive means. A bottom cover protects the bottom surface of the printed circuit board assembly. The compliant layer provides a mechanical decoupling of the forces produced by the contiguous materials above and below the compliant layer and the compliant layer has a Youngs Modulus of less than 20,000 psi over an operating temperature range.

BRIEF DESCRIPTION OF THE DRAWINGS

Other and further features and advantages of the invention will become apparent in connection with the accompanying drawings wherein.

DESCRIPTION OF THE PREFERRED EMBODIMENT

Figure 1:
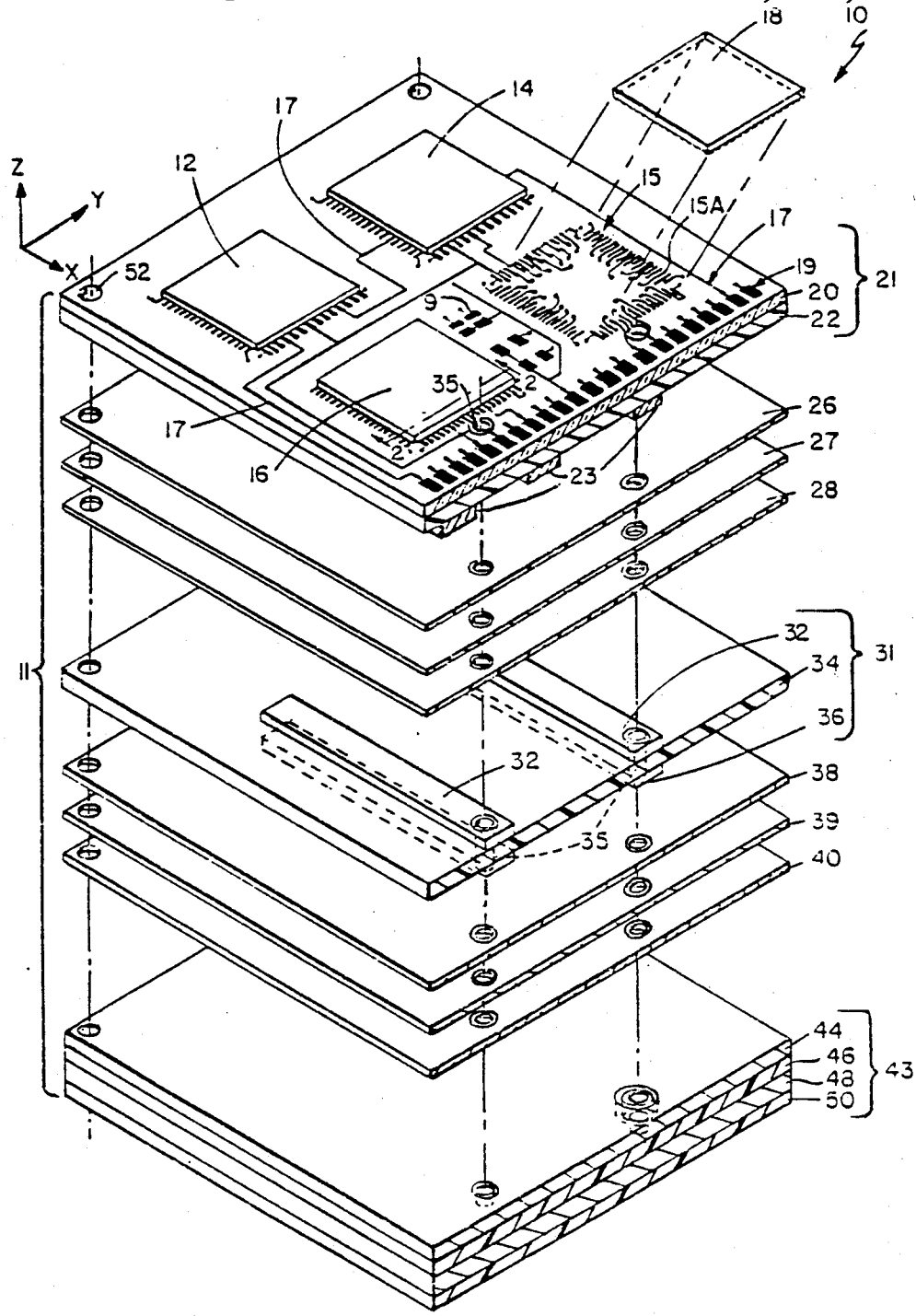
FIG. 1 illustrates a printed circuit board assembly comprising layers of materials according to the invention (shown in an exploded view) forming a printed circuit board and further comprising leadless chip carriers attached to the top surface of the printed circuit board.

Referring to FIG. 1, there is illustrated a printed circuit board (PCB) assembly according to the present invention, designated 10. The PCB assembly 10 comprises leadless chip carriers (LCC) 12, 14, 16, 18 attached to a printed circuit board 11. The thickness of the printed circuit board 11 is approximately 0.045 inches. The top section 21 of the printed circuit board 11 has a compliant layer 20 of suitable dielectric material (to be described in detail hereinafter) disposed between a pattern of conductors, comprising one or more patterns of conductive pads 15 for accomodating the attachment and interconnection of LCC 12, 14, 16, 18, and an insulating layer 22. Each conductive solder pad 15A comprises a layer of solder over a copper conductor forming a particular pad on continuing as a copper conductive strip 17 performing an interconnection upon the printed circuit board 11. A plurality of conductive pads along one edge of the printed circuit board 11 forms an input-output edge connector section 19. Other component conductive pads 9 provide for attachment of components such as chip capacitors to the PCB 11.

The layer 20 of insulating compliant material has formed on its upper surface copper conductors comprising the conductive pads 9 and 15, conductive strips 17 and input-output edge connector section 19. Said compliant material layer 20 provides the means for mechanically decoupling the LCC 12, 14, 16, 18 from the PCB lower parts 22-50. This mechanical decoupling of an LCC 12, 14, 16, 18 from the printed circuit board 11 eliminates the potential strain in the solder joints due to different thermal coefficients of expansion (TCE) of the PCB 11 and the LCC 12, 14, 16, 18 materials. The compliant layer 20 provides an elastic interface to the contiguous materials above and below said compliant layer, which produce forces resulting from the thermal expansion of the contiguous materials over an operational temperature range. The TCE for a ceramic LCC 12, 14, 16, 18 is typically 6 microinches/inch per °C. in the X, Y, and Z directions and the TCE for a printed circuit board is typically 16-19 microinches/inch per °C. in the X and Y directions and typically 60 microinches/inch per °C. in the Z direction. The compliant layer 20 prevents the forces resulting from the different TCE's over an operational temperature range from fracturing the LCC solder joints which provide the attaching means to the PCB 11.

Figure 2:
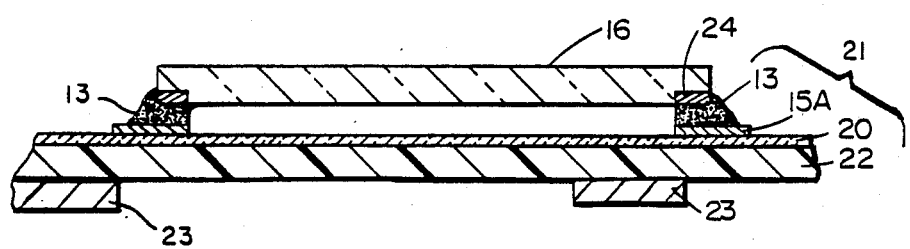
FIG. 2 illustrates the solder connections between a leadless chip carrier and conductive strip pads on a top section of a printed circuit board which includes a compliant layer according to the present invention.

Referring now to FIG. 2, solder joints 13 between an electrical terminal 24 of an LCC and a solder pad 15A of a PCB 11 are illustrated. The compliant material layer 20 isolates the greater movement of the insulating layer 22 from the lesser movement of the leadless chip carrier 16 over a temperature range and thereby prevents damage to the solder joints 13.

The compliant material layer 20 is a dielectric having a relatively low value for its Youngs Modulus, which relates stress to strain of a linear tension. The Youngs Modulus of a preferred compliant material layer 20 should be less than 20,000 psi over the operational temperature range in order to provide the proper mechanical decoupling between an LCC 12, 14, 16, 18 and lower parts 22-50 of PCB 11. The thickness of the compliant material layer 20 is determined by analytical or empirical data depending upon the specific PCB lower parts 22-50 materials and the thermal range requirements of a particular application. A severe or wide range thermal environment may require a thicker compliant material layer 20 having a lower Youngs Modulus depending on the TCE of the insulating layer 22 and other contiguous materials.

Suitable materials having a low value of the Youngs Modulus comprise a modified epoxy such as an F4425 laminate sold by OAK Materials Group Inc. of Franklin, N.H. or a nylon modified resin sold under the trademark Polycast by Fortin Co. of Sylmar, CA., or a resin polymer material sold under the trademark PFA or FEP Teflon by E. I. duPont deNemours and Company (hereinafter referred to as Dupont Co.) of Wilmington, Del., or a silicone resin sold under the trademark Sylgard 186 by Dow Corning of Midland, Mich., or a polyurethane resin sold under the trademark Uralane 5750 by M & T Chemical of Rahway, N.J.

Underlying the compliant material layer 20 is an insulating layer 22 which is a hard, fully cured, C-stage material such as an epoxy material manufactured by Nelco Corp. of Walden, NY. Under the C-stage material is a layer of copper conductive strips 23.

A second inner layer 31 is formed of the C-stage, epoxy insulating material 34 with layers of copper conductive strips 32 and 36 on the top surface and the bottom surface respectively of said insulating material 34. Between the copper conductive strips 23 and the copper conductive strips 32 are one or often more layers (three layers 26, 27, 28 are illustrated) of an insulating, partially cured and semi-hard, B-stage material such as an epoxy-glass material manufactured by Nelco Corp. of Walden, NY. which provides a means for bonding multilayers together. Under the copper conductive strips 36 are three additional layers 38, 39, 40 of the insulating, B-stage material for bonding the aforementioned layers to a bottom inner layer 43 of material.

The bottom inner layer 43 comprises a third layer of C-stage, insulating material 46 with layers of copper conductors 44 and 48 on the top surface and bottom surface of said third layer 46. These copper conductors are large compared to the conductive strips 17, 23, 32, 36 because they are used for power and ground distribution. Conductive strips 23, 32, 36, and conductors 44, 48 are shown in exagerated relative thickness for clarity. At the very bottom of PCB 11 is a cover sheet layer 50 of an insulating, B-stage material such as a material sold under the trademark NO FLO by Fortin Co. of Sylmar, Calif. which comprises a resin impregnated glass fiber cloth.

The method for making a printed circuit board 11 includes three photographic processes. First the various copper clad layers such as an inner layer 31, comprised of copper conductive strip layer 32, on top of an insulating material layer 34 which comprises an epoxy glass fiber laminate, and another copper conductive strip layer 36 under insulating material layer 34 are cleaned; then a photo polymer film, hereinafter called resist such as one sold under the trademark Riston by Dupont Co., of Wilmington, Del., is applied to both sides of an inner layer 31 by applying it to the top and bottom surfaces of copper layers 32 and 36 using, for example, an A-Laminator made by Dupont Co. An image is exposed on the copper layers 32 and 36 using, for example, a Model DMVL-824 Photo Exposure Unit made by Colight Inc. of Minneapolis, MN. The very top copper conductive strips 17, conductive pads 9 and 15 and connector section 19 of printed circuit board 11 are not formed at this point in the process. The exposed layers are developed in a photographic tank, such as a Conveyorized Aqueous Processor made by Dupont Co., and the processes of etching, stripping resist, scrubbing and drying are performed. The etching may be performed in an Etcher made by Chemcut Corp. of State College, PA. All the remaining copper on inner layer 31 is oxide treated to promote inner layer adhesion when all the printed circuit board layers are assembled together, and then the layer is rinsed and dried.

The various layers of the printed circuit board 11 are assembled one on top of the other, using an alignment hole 52 in each layer, into a PCB 11 composite as illustrated in FIG. 1. A copper layer comprising conductive pads 9 and 15, conductive strip 17 and edge connector section 19 is on top of a compliant layer 20 which is on top of a first inner layer comprising a C-stage (fully cured, hard) insulating material 22 having a copper layer 23 under said insulating material layer 22. Next are three layers 26, 27, 28 of a B-stage (partially cured, semi-hard) bonding resin glass followed by a second inner layer 31 of a C-stage, insulating material 34 with copper layers 32 and 36 on the top and bottom of said insulating material 34. Finally, there is a bottom inner layer 43 comprising a C-stage insulating material 46 with copper conductor layers 44 and 48 on the top and bottom respectively of said insulating material 46. The aforesaid multi-layer composite may be laminated at 325° F. and 300 psi for one hour in a lamination press such as one manufactured by Pasadena Hydraulics, Inc. of City of Industry, CA. and then cooled under pressure. Through-holes 35 are drilled in the laminated composite, wet abrading is performed and then the laminate is dried in an oven. Chemical and/or plasma etch back of the insulating materials is performed to expose more copper within the through-holes for reliable plated interconnection.

The next step is to perform an electroless copper deposition by a wet chemical process through all drilled holes and over all surfaces. An electrolytic copper plate of 0.0012 inches (1 ounce) minimum is applied. This is followed by wet abrading, cleaning and drying.

A second photo process includes applying resist to the top and bottom of the laminated composite of PCB 11. The top of said composite is exposed followed by exposing the bottom of said laminated composite of PCB 11. The composite is then put into a photographic tank for developing. The laminated composite is solder plated followed by rinsing, stripping resist, pumice scrubbing, rinsing and drying.

A third photo process is now performed on the composite of PCB 11 wherein resist is applied to the top and bottom surfaces of the copper conductive strip layers 17 and 48, as shown in FIG. 1. The pattern of conductive pads 15 and input-output edge connector section 19 are all considered part of the conductive strip layer 17 and the conductive patterns are exposed thereon. Likewise, a circuit pattern is exposed on the bottom conductive strip layer 48. The laminated composite is then passed through a photographic tank for developing. The purpose of these resist patterns is to protect the copper plated holes from any etching. Then an etching process occurs to take away unwanted background copper on top and bottom surfaces of conductive strip layers 17 and 48 which is followed by stripping resist, pumice scrubbing, rinsing and drying. The process of making a printed circuit board 11 is completed by applying a laminate insulation cover sheet 50 to the bottom of the laminated composite which may be a resin impregnated on glass fiber cloth sold under the trademark NO FLO by Fortin Co. of Sylmar, Calif.

This concludes the description of the preferred embodiment. However, many modifications and alterations will be obvious to one of ordinary skill in the art without departing from the spirit and scope of the invention concept. Therefore, it is intended that the scope of this invention be limited only by the appended claims.

What is claimed is:

1. A printed circuit board comprising:
    a plurality of conductive layer means comprising a top layer having a conductive pattern means for mounting at least one carrier means to said pattern means;
    a plurality of insulating layer means alternating between said conductive layer means, said conductive layer means performing electrical interconnection within said printed circuit board;
    one of said insulating layer means under said top layer of conductive pattern means comprising compliant material means for reducing forces between said carrier means and said printed circuit board due to different thermal coefficients of expansion of said carrier means and said printed circuit board said forces occurring during thermal variations of said printed circuit board; and
    said compliant layer means comprising a material having a Youngs Modulus of less than 20,000 psi over said thermal variations having a temperature range of at least −55° C. to +125° C.

2. The printed circuit board as recited in claim 1 wherein:
    said conductive layer means comprises conductive feedthrough holes for providing electrical connections through said insulating layer means.

3. The printed circuit board as recited in claim 1 wherein:
    said carrier means comprises a leadless chip carrier.

4. A printed circuit assembly comprising:
    a printed circuit board;
    means for attaching at least one leadless carrier means to said board;
    means underlying said attaching means for decoupling forces resulting from thermal variations of contiguous materials on said printed circuit board having different thermal coefficients of expansion, said decoupling forces means comprising a compliant material means having a Youngs Modulus of less than 20,000 psi over said thermal variations having a temperature range of at least −55° C. to +125° C.;
    said board including means for interconnecting signals of said carrier means;

means for insulating a plurality of said interconnecting means from each other; and means for adhering said interconnecting means and said insulating means together forming a multilayer composite.

5. The printed circuit board as recited in claim 4 wherein:

said printed circuit board further comprises a bottom layer of resin impregnated glass fiber material for protection of said board.

6. The printed circuit board as recited in claim 4 wherein:

said compliant material means comprises a base material including either a modified epoxy, a resin polymer, a silicone or a polyurethane.

7. A printed circuit board comprising:

first conductive means for attaching a leadless carrier means thereon;

compliant layer means underlying said first conductive means for providing an elastic interfacce to contiguous materials under said compliant layer means, said materials producing forces resulting from thermal variations of said contiguous materials having different thermal coefficients of expansion;

said compliant layer means comprising a material having a Youngs Modulus of less than 20,000 psi over said thermal variations having a temperature range of at least −55° C. to +125° C.;

first insulating layer means underlying said compliant layer means for providing structural support to said compliant layer means;

second conductive means disposed under said first insulating layer means for providing interconnections;

first bonding means for attaching said second conductive means to an adjacent third conductive means;

second insulating layer means having a top surface adjacent to said third conductive means and a bottom surface adjacent to a fourth conductive means;

second bonding means for attaching said fourth conductive means to an adjacent fifth conductive means;

third insulating layer means having a top surface adjacent to said fifth conductive means and a bottom surface adjacent to a sixth conductive means; and bottom cover means disposed under said sixth conductive means for protecting a bottom surface of said printed circuit board.

8. The printed circuit board as recited in claim 7 wherein:

said first conductive means comprises conductive pad means arranged to accommodate said leadless carrier means.

9. The printed circuit board as recited in claim 7 wherein:

said compliant layer means further provides a mechanical decoupling of forces between said printed circuit board and said carrier means.

10. The printed circuit board as recited in claim 7 wherein:

said compliant layer means comprises a base material including either a modified epoxy, a resin polymer, a silicone or a polyurethane.

11. The printed circuit board as recited in claim 7 wherein:

said first, second or third insulating layer means comprises a fully cured, hard, C-stage material.

12. The printed circuit board as recited in claim 7 wherein:

said bonding means comprises a partially cured, semi-hard B-stage material.

13. The printed circuit board as recited in claim 7 wherein:

said bottom cover means comprises a resin impregnated glass fiber material.

14. A printed circuit board assembly comprising:

a printed circuit board having a plurality of alternating insulating layer means and conductive means;

at least one leadless carrier means attached to said printed circuit board;

a pattern on a top layer of said conductive means comprising conductive pad means for attaching said leadless carrier means to said pad means;

one of said insulating layer means disposed under said top layer of said conductive means of said printed circuit board comprising compliant means for providing an elastic interface to contiguous materials above and below said compliant means, said contiguous material producing strain on said compliant means resulting from thermal variations of said contiguous materials having different coefficients of expansion; and said compliant means comprising a material having a Youngs Modulus of less than 20,000 psi over said thermal variations having a temperature range of at least −55° C. to +125° C.

15. The printed circuit board assembly as recited in claim 14 wherein:

said compliant means comprises a base material including either a modified epoxy, a resin polymer, a silicone or a polyurethane.

16. The printed circuit assembly as recited in claim 14 wherein:

said conductive means comprises plated feed-through holes for providing electrical connections through said insulating layer means.

17. A printed circuit board assembly comprising:

at least one leadless carrier means;

first conductive means for attaching said leadless carrier means thereon;

compliant layer means underlying said first conductive means for providing an elastic interface to contiguous materials above and below said compliant layer means, said contiguous material producing forces resulting from thermal variations of said contiguous materials having different coefficients of expansion;

said compliant layer means comprising a material having a Youngs Modulus of less than 20,000 psi over said thermal variations having a temperature range of at least −55° C. to +125° C.;

first insulating layer means underlying said compliant layer means for providing structural support to said compliant layer means;

second conductive means disposed under said first insulating layer means for providing interconnecting;

first bonding means for attaching said second conductive means to an adjacent third conductive means;

second insulating layer means having a top surface adjacent to said third conductive means and a bottom surface adjacent to a fourth conductive means;

second bonding means for attaching said fourth conductive means to an adjacent fifth conductive means;

third insulating layer means having a top surface adjacent to said fifth conductive means and a bottom surface adjacent to a sixth conductive means; and bottom cover means disposed under said sixth conductive means for protecting a bottom surface of said printed circuit board assembly.

18. The printed circuit board as recited in claim 17 wherein:

said first conductive means comprises conductive pad means arranged to accommodate said leadless carrier means.

19. The printed circuit board assembly as recited in claim 17 wherein:

said compliant layer means further provides a mechanical decoupling of said forces produced by said contiguous materials above and below said compliant layer means.

20. The printed circuit board as recited in claim 17 wherein:

said compliant layer means comprises a base material including either a modified epoxy, a resin polymer, a silicone or a polyurethane.

21. The printed circuit board as recited in claim 17 wherein:

said first, second and third insulating layer means comprises a fully cured, hard, C-stage material.

22. The printed circuit board as recited in claim 17 wherein:

said bonding means comprises a partially cured, semi-hard, B-stage material.

23. The printed circuit board as recited in claim 17 wherein:

said bottom cover means comprises a resin impregnated glass fiber cloth.

24. The method of making a printed circuit board comprising the steps of:

providing an insulating support means;

supporting an insulating compliant material means by said insulating support means, said compliant material means providing an elastic interface to said support means for decoupling forces resulting from thermal variations of adjacent materials having different thermal coefficients of expansion and having a Youngs Modulus of less than 20,000 psi over said thermal variations having a temperature range of at least −55° C. to +125° C.;

disposing a pattern of conductive means over said insulating compliant material means for performing electrical interconnections; and attaching at least one leadless chip carrier means to said pattern of conductive means.

25. The method of constructing a printed circuit board comprising:

providing a first conductive means for attaching a leadless carrier means thereon;

disposing an insulating compliant layer means, having a Youngs Modulus of less than 20,000 psi over thermal variations having a temperature range of at least −55° C. to +125° C., under said first conductive means for providing an elastic interface to contiguous materials under said compliant layer means, said materials producing forces resulting from said thermal variations of said contiguous materials having different coefficients of expansion;

disposing a first insulating means under said compliant layer means for providing support to said compliant layer means;

disposing a second conductive means under said first insulating layer means for providing interconnections;

attaching said second conductive means to an adjacent third conductive means using a first bonding means;

providing a second insulating layer means having a top surface adjacent to said third conductive means and a bottom surface adjacent to a fourth conductive means;

attaching said fourth conductive means to an adjacent fifth conductive means using a second bonding means;

providing a third insulating layer means having a top surface adjacent to said fifth conductive means and a bottom surface adjacent to a sixth conductive means;

protecting a bottom surface of said printed circuit board with a bottom cover means disposed under said sixth conductive means.

26. The method as recited in claim 25 wherein:

the step of providing a first conductive means further comprises the step of providing a pattern of conductive pad means to accommodate a connection configuration of said leadless carrier means.

27. The method as recited in claim 25 wherein:

said step of disposing an insulating compliant layer means under said first conductive means further comprises the step of providing a mechanical decoupling of forces between said printed circuit board and said carrier means.

28. The method as recited in claim 25 wherein:

said step of disposing said compliant layer means under said first conductive means further comprises the step of providing a base material including either a modified epoxy, a resin polymer, a silicone or a polyurethane.

29. The method as recited in claim 25 wherein:

said step of disposing said first, second and third insulating layer means further comprises the step of providing a fully cured, hard, C-stage material for said insulating layer means.

30. The method as recited in claim 25 wherein:

said step of attaching said second conductive means to said third conductive means and said fourth conductive means to said fifth conductive means further comprises the step of using bonding means comprising a partially cured, semi-hard, B-stage material.

31. The method as recited in claim 25 wherein:

said step of protecting a bottom surface of said printed circuit board by said bottom cover means further comprises using a resin impregnated glass fiber material.

32. The printed circuit board as recited in claim 1 wherein:

said complaint material means comprises a base material including either a modified epoxy, a resin polymer, a silicone or a polyurethane.

* * * * *